METHOD FOR FABRICATING SEMICONDUCTIVE DEVICES

Filed May 4, 1956

INVENTOR.
RICHARD A. WILLIAMS
BY
[signature]
ATTORNEY

United States Patent Office 2,930,108

Patented Mar. 29, 1960

2,930,108

METHOD FOR FABRICATING SEMICONDUCTIVE DEVICES

Richard A. Williams, Collingswood, N.J., assignor to Philco Corporation, Philadelphia, Pa., a corporation of Pennsylvania Application May 4, 1956, Serial No. 582,723

9 Claims. (Cl. 29—25.3)

This invention relates to an improved method for fabricating semiconductive devices, and more particularly to an improved method for forming a rectifying junction in a body of semiconductive material and for bonding a conductive structure to said body. Still more particularly, the invention relates to an improved method for fabricating transistors which are especially well suited for operation at high frequencies.

Heretofore transistors capable of efficiently amplifying high-frequency alternating currents have been difficult to mass-produce because of the small dimensions and the close tolerances to which the devices must be fabricated for satisfactory operation. Specifically, to enhance the high-frequency performance of a transistor by reducing to a minimum the transit time for minority carriers between its emitter and collector elements, it is necessary that these two elements be spaced from one another by only a very small distance, e.g., of the order of 0.0001 inch. Moreover, because such close spacing of these elements tends to produce between them a high capacitance, which would undesirably attenuate high-frequency signals supplied to the transistor, it is further required that this capacitance be minimized by utilizing emitter and collector elements having small areas. In addition, in order that the aforementioned transit time shall be substantially the same for all of the minority carriers, thereby to obtain a constant phase shift between the emitter and collector elements for alternating signals whose periods are of the order of the transit time, it is necessary that the opposing surfaces of the emitter and collector elements be substantially plane and parallel to each other. Finally, to obtain optimum amplification at any frequency, it is necessary that the emitter element of the transistor have a high minority-carrier injection efficiency.

A novel transistor embodying all of these characteristics, and accordingly having excellent high-frequency performance, is disclosed and claimed in the copending patent application Serial No. 585,670, now Patent No. 2,870,052 of Albert D. Rittmann, filed May 18, 1956, entitled "Semiconductive Device and Method for the Fabrication Thereof," and assigned to the assignee of the present application. More particularly, this transistor preferably comprises a body of semiconductive material containing a pair of opposed excavations, the bottom surfaces of which are substantially plane and parallel and separated by a distance substantially equal to the desired small distance between the emitter and collector elements. To obtain an emitter element having a high injection efficiency, a substantially plane configuration and the desired separation from the collector element, a very high concentration of activator atoms is alloyed to an extremely small depth into the surface of the semiconductive material at the bottom of one of the excavations. In fabricating the Rittmann device, the desired alloy region has been formed by coating the latter surface with a metal, by applying the activator substance to the metal coating, and by heating the coating and the activator substance sufficiently to alloy the activator substance with the underlying semiconductive material. After the emitter element has been thus formed, a conductive lead may be applied thereto. To obtain a collector element having said plane configuration and the desired separation from the emitter element, an element having a structure similar to that of the emitter element may be formed at the bottom of the other excavation in the semiconductive body or alternatively, a surface-barrier electrode may be formed in this same region and a lead applied thereto in well-known manner. Inasmuch as the method of fabrication, structure and operation of the Rittmann transistor are fully described in the above-identified application, no further discussion thereof is deemed to be necessary herein.

It is an object of the invention to provide an improved method for fabricating semiconductive devices.

Another object of the invention is to provide an improved method of forming a rectifying junction in a body of semiconductive material and of bonding a conductive structure to said body.

An additional object of the invention is to provide an improved method of forming an emitter element on a semi-conductive body and of bonding a conductor to said emitter element.

Yet another object of the invention is to provide an improved method of forming, on a semiconductive body, an emitter or collector element having a precisely determined configuration and position, and to which a connecting lead is secured.

A further object of the invention is to provide an improved method for fabricating transistors which, because of its simplicity, is especially well adapted for use in mass-producing these devices.

A specific object of the invention is to provide an improved method for forming, on a semiconductive body, an exceptionally thin element for injecting minority carriers thereinto, and for bonding a conductor to said element.

These objects are achieved by the provision of my novel method, according to which a region of a semiconductive body is coated with a metal, and a solder including an activator substance is applied between a conductive structure and this metal coating. The solder is then heated to a sufficiently high temperature to melt it, thereby to cause a mixture to form between a portion of the semiconductive body contiguous said metal coating and the activator substance contained in the solder. This mixture and the solder are then cooled below their respective melting points, thereby to form a rectifying junction in the region of the body contiguous said metal coating and simultaneously to bond the conductive structure to the body.

In a more specific embodiment, the method of my invention is utilized to form an emitter element on an n-type semiconductive body and to bond a conductive lead to this emitter element. In this embodiment, the metal coating applied to the semiconductive body is constituted of a metal of the acceptor type. The solder which is applied between the conductive structure and the coating includes this metal as one component, and, as another component, includes a substance which is a p-type activator and which has a solubility, in the semiconductive body, substantially greater than that of the coating metal. Moreover, in the present embodiment, both the coating metal and the solder are heated above their respective melting points, thereby to melt together the coating metal and the solder and to dissolve into this melt a portion of the semiconductive body contiguous thereto. Subsequently, the resultant mixture, consisting of the solder, the coating metal and the dissolved portion of the semiconductive body is cooled below its melting point, thereby forming the emitter element and bonding the conductive lead thereto.

In a preferred embodiment of my method particularly applicable to the fabrication of high-frequency transistors, opposing surfaces of the semiconductive body are shaped to the desired configuration by electrolytic jet etching, and the metal coating is applied to appropriate regions of these etched surfaces by electrolytic jet plating. The activator-containing solder is coated onto one end of a conductive lead, and this end is abutted against one of the metal coatings. Heat is then applied to the solder in an amount just sufficient to melt the solder and the metal coating which it abuts. The structure is then permitted to cool, thereby causing an extremely thin alloyed region to form beneath the surface of the semiconductive body adjoining the metal coating, and the conductive lead to be bonded to this region.

Other advantages and features of the invention will become apparent from a consideration of the following detailed description taken in connection with the accompanying drawings, in which.

Figure 1:
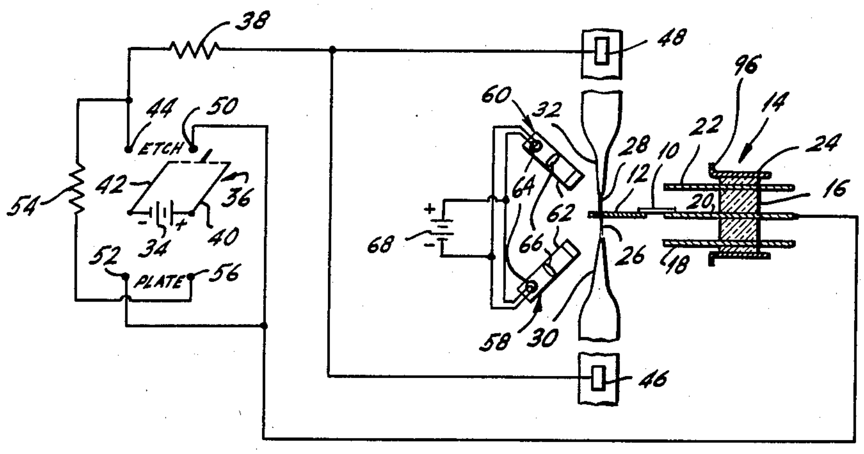
Figure 1 illustrates diagrammatically an electrochemical arrangement suitable for practicing certain steps of my novel method.

In the specific embodiment of the method of my invention now to be described in detail, a high frequency transistor of the type described in the above-identified Rittmann application is fabricated in the following general manner: opposing surfaces of a wafer of n-type semiconductive material, e.g. n-type germanium, are electrolytically etched in a manner such as to produce coaxial and opposing depressions whose bottom surfaces are spaced from one another by a predetermined small distance and are substantially plane and parallel to one another over substantial regions thereof. A p-type activator metal, e.g. indium, is then electroplated over those portions of the plane regions of the respective surfaces on which it is desired to form the emitter and collector elements. To form the emitter element, the end of a wire lead having a globule of solder electrodeposited thereon is abutted against the appropriate one of the metal platings. As an important aspect of the method of my invention, this solder consists primarily of the same metal as that plated onto the wafer, i.e. indium, and importantly and additionally contains a small amount of a second p-type activator substance, e.g. gallium, having a solid solubility in germanium which is considerably greater than that of the indium. Heat is then applied to the solder and the metal plating in an amount just sufficient to melt them and to cause them to intermix and to dissolve a very small portion of the semiconductive material contiguous thereto. The resultant mixture of the solder, the plating metal and the dissolved semiconductive material is then cooled below its freezing temperature, thereby to form a rectifying junction and simultaneously to bond the wire lead thereto.

Because the solid solubility in germanium of gallium is intrinsically very large and also is much greater than that of indium, the solid solution formed between the dissolved germanium and the mixture of plating metal and solder contains much more gallium than indium, and the gallium is present, in this solid solution, in a very high concentration, e.g. of the order of at least $10^{19}$ atoms of gallium per cubic centimeter of germanium. As a result, the rectifying junction formed by my process has a high injection efficiency and serves as an excellent emitter element. Moreover, because the heating step is carried out at such a low temperature, e.g. 165° C., and for such a short time, e.g. of the order of 3 to 5 seconds, only a very thin layer beneath the surface of the semiconductive body, e.g. of the order of $10^{-6}$ inch, contains this gallium. Accordingly the shape of the rectifying junction substantially conforms to that of the semiconductive surface upon which the indium was electrodeposited initially. In addition, the periphery of the junction is precisely defined, inasmuch as the junction tends to form only beneath the portion of the semiconductive body over which the indium was initially plated. Lastly, the process is efficient in that it accomplishes, in one operation, both the formation of the rectifying junction and the bonding of the wire lead thereto.

The collector element of the transistor may be formed by carrying out steps similar to those used to form the emitter element. Alternatively, the surface-barrier contact to the surface of the germanium, which is already provided by the indium electroplated thereon, may be utilized without further processing as a collector element. In such a case, a wire lead may be affixed thereto in a conventional manner, e.g. by utilizing a solder, such as an indium-cadmium eutectic mixture, having a melting point substantially lower than the melting point of indium.

One specific example of how the invention may be applied to fabricate a particular type of high-frequency transistor will now be described in greater detail, with particular reference to the several drawings.

In this example, a nickel base tab 10 is first soldered, in a manner providing an ohmic contact, to one end of a wafer 12 of n-type germanium having a bulk resistivity in the range of 0.05 to 0.09 ohm-centimeters and a minority-carrier lifetime exceeding 50 microseconds. Typically, wafer 12 may have a thickness of 0.002 inch, and a length and width of 0.100 inch and 0.050 inch respectively, and the solder securing the base tab 10 thereto may be constituted primarily of tin.

The assembly consisting of wafer 12 and base tab 10 is then secured to a mounting structure 14 which comprises a cylindrical glass stem 16, in which are embedded three nickel-plated copper stem leads 18, 20 and 22, in parallel coplanar relationship to the axis of the stem, and a flanged metal shell 24 which tightly surrounds the glass stem. Specifically, the assembly is secured to the mounting structure by spot-welding base tab 10 to the central stem lead 20 of structure 14. The germanium wafer 12 is then positioned normal to and between a pair of opposing coaxial jets of electrolytic solution 26 and 28, respectively, which are ejected from nozzles 30 and 32 respectively, and which are respectively about 0.003 inch and 0.006 inch in diameter. The composition of the electrolytic solution, which contains indium ions, is discussed in greater detail hereinafter.

Wafer 12 having been appropriately positioned, the surfaces thereof impinged by jets 26 and 28 are etched electrolytically by applying to the jets a potential which is negative with respect to wafer 12, and by irradiating with light the surfaces to be etched. The negative potential is supplied to the jets by a source 34 via a double-pole, double-throw switch 36 and a current-limiting resistor 38. More particularly, the positive and negative terminals of source 34 are connected respectively to poles 40 and 42 of switch 36. A first fixed contact 44 of switch 36 is connected by resistor 38 to inert electrodes 46 and 48 which are immersed in the streams of electrolytic solution supplying jets 26 and 28, respectively, while a second fixed contact 50 is connected to wafer 12 by way of stem lead 20. Switch contact 50 also is connected directly to a third switch contact 52, while switch contact 44 is connected, via a second current-limiting resistor 54, to a fourth switch contact 56. Accordingly, to produce electrolytic etching, switch 36 is closed to its upper pair of contacts, while to produce electrolytic plating, switch 36 is closed to its lower pair of contacts.

The light for irradiating the etched surfaces of wafer 12 is supplied by light sources 58 and 60, respectively, each of which comprises a housing 62, an electric bulb 64 and a condensing lens 66 for directing the light produced by bulb 64 onto the appropriate surface of wafer 12. The bulbs 64 are energized by a source 68.

The electrolytic etching of wafer 12 is continued until the distance between the surfaces impinged by jets 26 and 28 has been reduced to approximately 0.0001 inch. Preferably, the value of the distance between the etched surfaces is continuously monitored during etching by arrangements such as the infra-red transmittance measuring system described and claimed in patent application Serial No. 449,347, now Patent No. 2,875,141, of Robert N. Noyce, filed August 12, 1954, and entitled "Electrical Method and Apparatus," or by the punch-through voltage measuring system described and claimed in patent application Serial No. 575,159 of William E. Bradley and John Roschen, filed March 30, 1956 and entitled "Electrochemical Method and Apparatus," both of which applications are assigned to the assignee of the present application. When the distance between the etched surfaces has been reduced to approximately 0.0001 inch, electrolytic etching is discontinued by opening switch 36 from its upper contacts.

Next, indium dots are caused to deposit electrolytically upon the respective etched surfaces of wafer 12 by closing switch 36 to its lower contacts, thereby applying to wafer 12 a negative potential which serves to discharge indium ions contained in the electrolytic solution which impinges the wafer. The electroplating process is continued until a first dot approximately 0.003 inch in diameter and approximately 0.0005 inch thick at its thickest portion has deposited on the surface of wafer 12 impinged by jet 26, and a second dot approximately 0.006 inch in diameter and approximately 0.001 inch thick at its thickest portion has deposited on the surface of wafer 12 impinged by jet 28. At this time, switch 36 is opened, discontinuing the electrolytic process.

In carrying out the above-described electrochemical steps, an electrolytic solution having the following composition has been found to give particularly satisfactory results:

| | | |
|---|---|---|
| Indium sulfate | grams | 15.4 |
| Ammonium chloride | do | 11 |
| D-tartaric acid | do | 1.5 |
| Sodium salt of ethylene diamine tetra-acetic acid | grams | 2 |
| Water | liter | 1 |

When this solution is utilized, the following additional process conditions have been found to produce smooth etching and adherent plating:

| | |
|---|---|
| Diameter of jet 26 at orifice of nozzle 30 | 0.003 inch. |
| Diameter of jet 28 at orifice of nozzle 32 | 0.006 inch. |
| Presure under which electrolyte is supplied to nozzle 30 | about 15 pounds per square inch. |
| Pressure under which electrolyte is supplied to nozzle 32 | about 6 to 8 pounds per square inch. |
| Temperature of electrolyte | 25° C. |
| Intensity of etching current supplied to jet 26 | 0.6 to 0.8 milliampere. |
| Intensity of etching current supplied to jet 28 | 0.8 to 1.0 milliampere. |
| Intensity of plating current supplied to jet 26 | 0.1 milliampere. |
| Intensity of plating current supplied to jet 28 | 0.2 milliampere. |

Under these conditions, the time required to etch germanium wafer 12 from an initial thickness of 0.002 inch to a final thickness of about 0.0001 inch is about one minute. Between 30 and 40 seconds are then required to plate indium dots of appropriate size onto the etched surfaces of the wafer.

Additional details concerning jet electrolytic etching and plating are discussed in the copending patent application Serial No. 472,824 of John W. Tiley and Richard A. Williams, filed December 3, 1954, entitled, "Semiconductive Devices and Methods for the Fabrication Thereof," and assigned to the assignee of the present application, as well as in the above-identified Noyce, and Bradley and Roschen applications. Accordingly, it is believed to be unnecessary to discuss the jet electrolytic process further herein.

After the indium dots have been plated onto germanium wafer 12, the entire transistor assembly is rinsed in distilled water, thereby to remove the electrolytic solution, and is dried by means of an air jet.

Two wire leads, for providing connections between stem leads 18 and 22 and the emitter and collector elements to be formed according to my invention, are now prepared by plating a globule of a special solder onto one end of each of two pure nickel wires, each having a diameter of approximately 0.001 inch, and by then bending each wire into an appropriate shape. More particularly, and in accordance with one aspect of the invention, this special solder contains indium and, importantly, also contains a small amount of gallium. Preferably the solder contains 99 percent by weight of indium and 1 percent by weight of gallium, although it may contain as much as 2 percent, or as little as 0.5 percent, of gallium. In plating the globule of solder onto the end of the wire lead, a solution having the following composition has been found to produce a dense, non-porous, adherent globule:

| | Grams |
|---|---|
| Glycerol | 100 |
| Indium trichloride | 7 |
| Gallium trichloride | 1 |
| Ammonium chloride | 5 |

The masses indicated above relate to the anhydrous form of each of these four compounds.

In preparing this plating solution, the glycerol is first heated to a temperature of 140° C. The indium, gallium, and ammonium salts are then stirred into the glycerol in the order given. Preferably, each salt is completely dissolved in the glycerol before the succeeding salt is added.

During plating, this solution is maintained at a temperature between 135° C. and 145° C. The end of the wire lead to be plated, and an anode made of an inert material, e.g. carbon, are immersed in the solution. The positive pole of a voltage source supplying between 15 and 21 volts is connected to the inert anode, while the negative pole of the source is connected to the wire lead, which then serves as the cathode of the plating process. As long as the plating process is continued, indium and gallium deposit in the desired relative amounts upon the end of the wire lead immersed in the solution. When a sufficient mass of solder has deposited thereon, the lead is removed from the plating solution and is bent appropriately.

Figure 2:
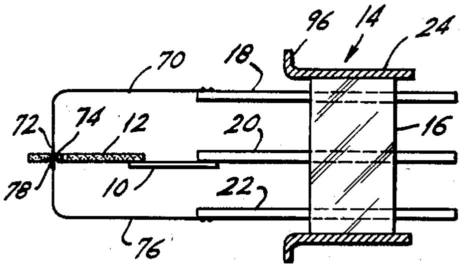
Figure 2 depicts a transistor in an intermediate stage of its fabrication according to my method.

When both wire leads have been prepared in the aforedescribed manner, the globule of solder coated upon each of them is abutted against the appropriate indium dot plated on semiconductive wafer 12, while the uncoated end of each wire lead is spot-welded to the appropriate stem lead of mounting structure 14. More particularly, and as shown in Figure 2, the end of a first wire lead 70 having a globule 72 of the aforedescribed solder coated thereon is abutted against the smaller of the indium dots 74, beneath which the emitter element of the transistor is to be formed, while the other end of lead 70 is spot welded to stem lead 18. Similarly, the solder-coated end of a second wire lead 76 is abutted against the larger of the two indium dots 78, beneath which the collector element of the transistor is to be formed, while the other end of lead 76 is spot-welded to stem lead 22. In this regard, it is preferred that the emitter element, as finally formed, have a smaller diameter than that of the collector element so that, in operation, the collector element will intercept substantially all of those minority carriers injected by the emitter element which reach the surface to which the collector element is applied.

Figure 3:
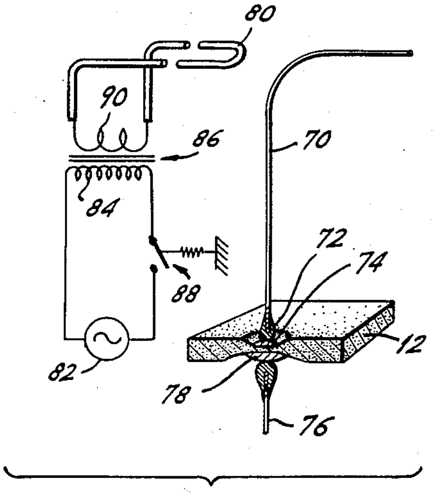
Figure 3 is a diagram of an arrangement suitable for carrying out a further step of my method.

Figure 3 shows a greatly enlarged view, partially in cross-section, of the positioning of leads 70 and 76 with relation to a "hairpin" heater element 80. Specifically, heater element 80 is positioned closely to wire lead 70 which is itself oriented vertically upward from dot 74. In a typical case, heater element 80 may be spaced about a sixteenth of an inch from lead 70. To energize heater element 80, a source of alternating current 82 is connected to the primary winding 84 of a current step-up transformer 86 by way of a normally-open, momentary-contact switch 88, while the secondary winding 90 of transformer 86 is connected to the terminals of heater element 80.

Just prior to performing the heating step of my novel method, a flux consisting of a saturated solution of zinc chloride in ethylene glycol is applied between solder globule 72 and indium dot 74. Then, in accordance with my invention, the emitter element is formed within germanium wafer 12 beneath indium dot 74, and simultaneously wire lead 70 is bonded to this emitter element by heating indium dot 74 and solder globule 72 slightly above their respective melting points for a short time and then permitting the mixture of solder, indium and dissolved germanium so produced to cool below its melting point. More specifically, the globule and dot are heated radiatively by closing switch 88, thereby causing heater element 80 to be energized. In practice, switch 88 may be closed intermittently over a period of approximately 5 seconds. Heater element 80 is de-energized as soon as globule 72 melts, a condition that is evidenced by a sagging of the globule. The transistor assembly is then allowed to cool, with the result that an alloy-junction emitter element forms just beneath the surface of wafer 12 upon which dot 74 initially was plated, and wire lead 70 becomes bonded to this emitter element. To assure strong bonding of lead 70 to the element, the transistor assembly is maintained stationary until the solder refreezes.

Figure 4:
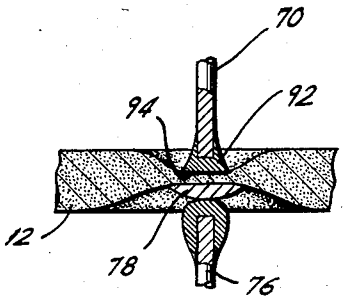
Figure 4 illustrates diagrammatically a structure produced by practicing my method.

The resultant structure produced by this important step of my method is depicted diagrammatically in Figure 4 and comprises a metallic mass 92 which consists primarily of indium and is firmly adherent to wire lead 70 and to the alloy region 94 formed just beneath the surface of germanium wafer 12. This alloy region is constituted of a very high concentration of gallium in solid solution with the germanium of wafer 12, e.g. $10^{19}$ atoms of gallium per cubic centimeter of germanium, and has an extremely small thickness, e.g., of the order of $10^{-6}$ inch. Because of the extreme thinness of region 94, the shape of the rectifying junction formed between this region and wafer 12 has substantially the same configuration as the surface to which indium dot 74 initially was applied, and the rectifying junction is spaced from the opposing etched surfaces of wafer 12 by substantially the original distance between the two etched surfaces.

The collector element is formed on the opposing surface of germanium wafer 12 by a technique substantially identical to that used to form the emitter element. Specifically the transistor assembly is rotated so that wire lead 76 associated with indium dot 78 extends vertically upward therefrom and is positioned close to the heater element 80, and the aforedescribed fluxing, heating and cooling operations are carried out once more. The collector junction so produced is also extremely thin, substantially conforming to the configuration of the surface to which it is applied, and presents a high impedance when reverse biased because of the high concentration of gallium atoms dissolved in the germanium of wafer 12.

Accordingly, by carrying out the above-listed steps of my novel process, a transistor is produced easily and quickly, whose emitter and collector elements have precisely predetermined sizes, shapes and positions relative to one another, and have wire leads attached thereto. Because such close control may be maintained over the geometry of the transistor elements, it is feasible to position the emitter and collector elements extremely close to each other without the danger that a short-circuit may occur therebetween. Consequently this process is especially useful for producing transistors designed to operate at high frequencies.

To complete the transistor, the assembly is first rinsed in distilled water, and is then air dried by a jet of air at room temperature. To remove any chemical contaminants which may have collected on the semiconductive surfaces during the processing thereof, base tab 10 and semiconductive wafer 12 are next immersed for 3 seconds in a chemical etchant consisting of:

| | Parts-by-volume |
|---|---|
| Acetic acid | 15 |
| Nitric acid | 8 |
| Hydrofluoric acid | 5 |

Each of the foregoing acids is in its concentrated form. Thereafter, the assembly is rinsed in distilled water to remove the etching solution. Subsequently the assembly is dried first by a jet of air at room temperature and then by a jet of warm air. The unit is then vacuum-baked, at a temperature of 85° C., for 15 minutes. Next, the transistor assembly is potted in a plastic which, in a typical case, may be a thermosetting epoxy resin, and finally the assembly is hermetically sealed within a metal can (not shown) which is spot-welded to the flange 96 of shell 24.

It is to be understood that the specific example of my novel method just described is merely exemplary, and that I do not intend to limit my invention thereto. In this regard, it is first noted that it is not necessary that the depression formed in the semiconductive wafer 12 be produced by electrolytic etching. For example, well-known sand-blasting techniques followed by chemical etching may be employed. Moreover, the metal plating applied to the excavated surfaces of the semiconductive body need not be electroplated thereon but, for example, may be evaporated thereon. Furthermore, the indium-gallium solder need not be electroplated onto the wire leads but alternatively may be introduced between the wire lead and the indium dot, at the appropriate time, in any other convenient manner. Even where the indium and gallium are electroplated onto the end of the wire lead, they need not be electroplated thereon simultaneously from the same plating bath. For example, in another useful modification of my method, the indium is first electroplated onto the wire lead and thereafter the gallium is plated over the already-deposited indium.

In addition, the heat which is utilized to melt the solder globule and the metal coating need not be applied radiatively, but may be applied by any one of a number of other well-known techniques. More specifically, such heat may be applied conductively via the wire lead, or alternatively, may be applied by directing a jet of hot gas in the vicinity of the solder globule, or by immersing semiconductive wafer 12 and its wire leads 70 and 76 in a bath of a fluxing agent maintained at a temperature exceeding the melting point of the solder. For example, in the specific instance where the plating metal is indium and the solder is indium-gallium the bath may consist of either ethylene glycol or glycerol maintained at a temperature between 160° C. and 165° C. and the semiconductive wafer and leads may be immersed therein for 3 seconds.

It will be understood that the method is not limited to the fabrication of transistors comprising n-type germanium wafers, but may also be practiced in fabricating transistors comprising other n-type semiconductive bodies as well as p-type semiconductive bodies.

While I have described my invention by means of specific examples and in a specific embodiment, I do not wish to be limited thereto, for obvious modifications will occur to those skilled in the art without departing from the scope of my invention.

What I claim is:

1. In a method of fabricating a signal-translating device comprising a body of semiconductive material, the steps of: etching said semiconductive body so as to provide a pair of opposing surfaces having given configurations and separated by a given distance; coating metal over a portion of each of said surfaces; positioning, adjacent one of said metal coatings, a conductor and a solder containing an activator substance; heating said solder sufficiently to melt it and to form a mixture between said activator substance and a portion of said semiconductive body contiguous said one metal coating, and cooling said mixture and said solder below their respective melting points, thereby to form a rectifying junction in said body and to bond said conductor to said body.

2. A method according to the method of claim 1, said method additionally including the step of securing a conductor to the other of said metal coatings.

3. A method according to the method of claim 1, wherein said step of etching said body includes the step of electrolytically etching said body, and wherein said step of coating metal over said predetermined portions includes the step of electrolytically plating said metal over said portions.

4. In a method of fabricating a transistor having a body of n-type germanium, the steps of: electrolytically etching said body so as to provide a pair of opposing surfaces having given configurations and separated by a predetermined distance; electrolytically plating indium over a portion of each of said surfaces; positioning, adjacent one of said indium platings, a conductor and a solder consisting of indium and gallium, said gallium being present in said solder in an amount lying in the range 0.5 to 2 percent by weight, inclusive; heating said solder and said one indium plating sufficiently to melt them and to form a mixture between said solder, said one indium plating and a portion of said germanium contiguous said latter plating; and cooling said mixture below its melting point, thereby to form a rectifying junction in said body and to connect said conductor to said junction.

5. The method of forming a rectifying junction in a body of semiconductive material containing impurity atoms predominantly of one activator type and of bonding a conductive structure to said body, comprising the steps of: coating a region of said body with an activator metal constituted predominantly of an activator substance of impurity type opposite said one type; applying between said structure and said coating a solder including an activator substance of said opposite impurity type; heating said solder sufficiently to form a liquid mixture between a portion of said semiconductive material, said metal coating and said solder; and cooling said mixture below its melting point substantially immediately after said mixture forms, thereby to form said rectifying junction and to bond said structure to said body.

6. A method according to claim 5, wherein said body is composed of n-type germanium, wherein said activator metal is indium, wherein said solder consists essentially of indium and gallium, said gallium being present in said solder in a concentration of between about 0.5 and about 2 percent by weight, and wherein said heating step includes the step of heating said solder to a temperature between substantially 160 and 165 degrees centigrade for a time between about three and five seconds.

7. A method according to claim 5 wherein said step of coating said body region with said activator metal includes the step of electroplating said activator metal onto said region.

8. A method according to claim 5 wherein said body is composed of n-type germanium, wherein said solder consists essentially of indium and gallium, said gallium being present in said solder in a concentration between about 0.5 and about 2 percent by weight, and wherein said step of coating said body region with said activator metal comprises the step of electroplating indium onto said region.

9. A method according to claim 5, wherein said solder consists essentially of said activator metal and a substance which is of said opposite impurity type and which has a solid solubility in said semiconductive body substantially greater than that of said activator metal.

References Cited in the file of this patent

UNITED STATES PATENTS

| | | |
|---|---|---|
| 2,603,693 | Kircher | July 15, 1952 |
| 2,750,542 | Armstrong et al. | June 12, 1956 |